(12) United States Patent
Nakamura et al.

(10) Patent No.: US 10,582,607 B2
(45) Date of Patent: Mar. 3, 2020

(54) CIRCUIT ASSEMBLY HAVING A HEAT TRANSFER MEMBER

(71) Applicants: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

(72) Inventors: Arinobu Nakamura, Mie (JP); Tou Chin, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 16/099,527

(22) PCT Filed: May 11, 2017

(86) PCT No.: PCT/JP2017/017839
§ 371 (c)(1),
(2) Date: Nov. 7, 2018

(87) PCT Pub. No.: WO2017/199836
PCT Pub. Date: Nov. 23, 2017

(65) Prior Publication Data
US 2019/0166683 A1    May 30, 2019

(30) Foreign Application Priority Data

May 17, 2016    (JP) .................................. 2016-099046

(51) Int. Cl.
*H05K 1/02*    (2006.01)
*H01L 23/36*    (2006.01)
(Continued)

(52) U.S. Cl.
CPC ........... *H05K 1/0203* (2013.01); *H01L 23/36* (2013.01); *H01L 23/4006* (2013.01);
(Continued)

(58) Field of Classification Search
CPC .... H05K 7/20845–20854; H05K 7/2089–209; H05K 7/2049;
(Continued)

(56) References Cited

U.S. PATENT DOCUMENTS

2007/0053163 A1* 3/2007 Thompson .......... H01L 23/4093
                                                               361/704
2010/0091464 A1* 4/2010 Ohnishi ................ H01L 23/053
                                                               361/723
(Continued)

FOREIGN PATENT DOCUMENTS

JP    2012-200071    * 10/2012
JP    2015-088556 A    5/2015
WO    2016-104110 A1    6/2016

OTHER PUBLICATIONS

International Search Report, Application No. PCT/JP2017/017839 dated Aug. 8, 2017.

*Primary Examiner* — Zachary Pape
(74) *Attorney, Agent, or Firm* — Honigman LLP

(57) ABSTRACT

Provided is a circuit assembly including: a circuit board; a bus bar having a top face fixed to a bottom face of the circuit board; an electronic component disposed on a top face of the bus bar; a heat dissipation member disposed on a bottom face of the bus bar; a heat transfer member interposed between the bus bar and the heat dissipation member, to transfer heat of the bus bar to the heat dissipation member; and a screw extending through a stack of the circuit board and the bus bar, the screw screwed to the heat dissipation member, fixing the stack to the heat dissipation member; and a spacer interposed between the circuit board and the heat (Continued)

dissipation member, the spacer surrounding at least a portion of an outer circumference of a shaft portion of the screw, and maintaining a thickness of the heat transfer member substantially uniform.

6 Claims, 9 Drawing Sheets

(51) Int. Cl.
*H01L 23/40* (2006.01)
*H05K 7/20* (2006.01)
*H05K 1/18* (2006.01)

(52) U.S. Cl.
CPC ...... *H05K 1/181* (2013.01); *H01L 2023/4062* (2013.01); *H01L 2023/4087* (2013.01); *H05K 7/209* (2013.01); *H05K 7/2049* (2013.01); *H05K 7/20472* (2013.01); *H05K 2201/066* (2013.01); *H05K 2201/10166* (2013.01); *H05K 2201/10272* (2013.01); *H05K 2201/10409* (2013.01)

(58) Field of Classification Search
CPC . H05K 1/0203; H05K 7/20381–20518; H05K 1/0201–0204; H01L 23/40–4006
USPC .......................... 361/709–723; 174/68.2, 252
See application file for complete search history.

(56) References Cited

U.S. PATENT DOCUMENTS

| | | | |
|---|---|---|---|
| 2013/0343015 A1* | 12/2013 | Malek | H05K 7/1417 361/752 |
| 2017/0047720 A1 | 2/2017 | Kobayashi et al. | |
| 2017/0318659 A1* | 11/2017 | Chin | H05K 7/20472 |
| 2018/0370463 A1* | 12/2018 | Haraguchi | H02G 3/16 |
| 2018/0376613 A1* | 12/2018 | Chida | H05K 7/20 |

* cited by examiner

CIRCUIT ASSEMBLY HAVING A HEAT TRANSFER MEMBER

CROSS-REFERENCE TO RELATED APPLICATIONS

This application is the U.S. national stage of PCT/JP2017/017839 filed May 11, 2017, which claims priority of Japanese Patent Application No. JP 2016-099046 filed May 17, 2016.

TECHNICAL FIELD

The present disclosure relates to a circuit assembly.

This application is based upon and claims the benefit of priority from the corresponding Japanese Patent Application No. 2016-099046 filed on May 17, 2016, the entire contents of which are incorporated herein by reference.

BACKGROUND

An electrical junction box that distributes power from a power supply (battery) to loads such as a headlamp and a wiper is installed in automobiles. Examples of a member constituting the internal circuit of such an electrical junction box include a circuit assembly described in JP 2003-164040A.

This circuit assembly includes a control circuit board on which a conductor pattern (circuit pattern) is formed, an input terminal bus bar and an output terminal bus bar that are bonded to the control circuit board, and a FET (Field effect transistor: electronic component) mounted to the control circuit board and the two bus bars. The FET includes a body (package), a source terminal and a gate terminal that protrude from a side surface of the body and extend downward, and a drain terminal provided on the back surface of the body. The drain terminal of the FET is electrically connected to the input terminal bus bar, and the source terminal is electrically connected to the output terminal bus bar. The connection can be achieved with solder. The gate terminal of the FET is bent and displaced in the upward direction relative to the source terminal by an amount corresponding to the thickness of the control circuit board, and is electrically connected to the conductor pattern of the control circuit board on the output terminal bus bar. The bus bar is fixed to a top face of the heat dissipation member via an adhesive (heat transfer member). The control circuit board and the bus bar are screwed to the heat dissipation member as needed.

SUMMARY

A circuit assembly according to an aspect of the present disclosure includes a circuit board and a bus bar having a top face that is fixed to a bottom face of the circuit board. An electronic component is disposed on a top face of the bus bar. A heat dissipation member is disposed on a bottom face of the bus bar. A heat transfer member is interposed between the bus bar and the heat dissipation member, to transfer heat of the bus bar to the heat dissipation member. A screw extends through a stack of the circuit board and the bus bar, the screw being screwed to the heat dissipation member and fixing the stack to the heat dissipation member. A spacer is interposed between the circuit board and the heat dissipation member, the spacer surrounding at least a portion of an outer circumference of a shaft portion of the screw, and maintaining a thickness of the heat transfer member substantially uniform.

DESCRIPTION OF EMBODIMENTS

Figure 1:
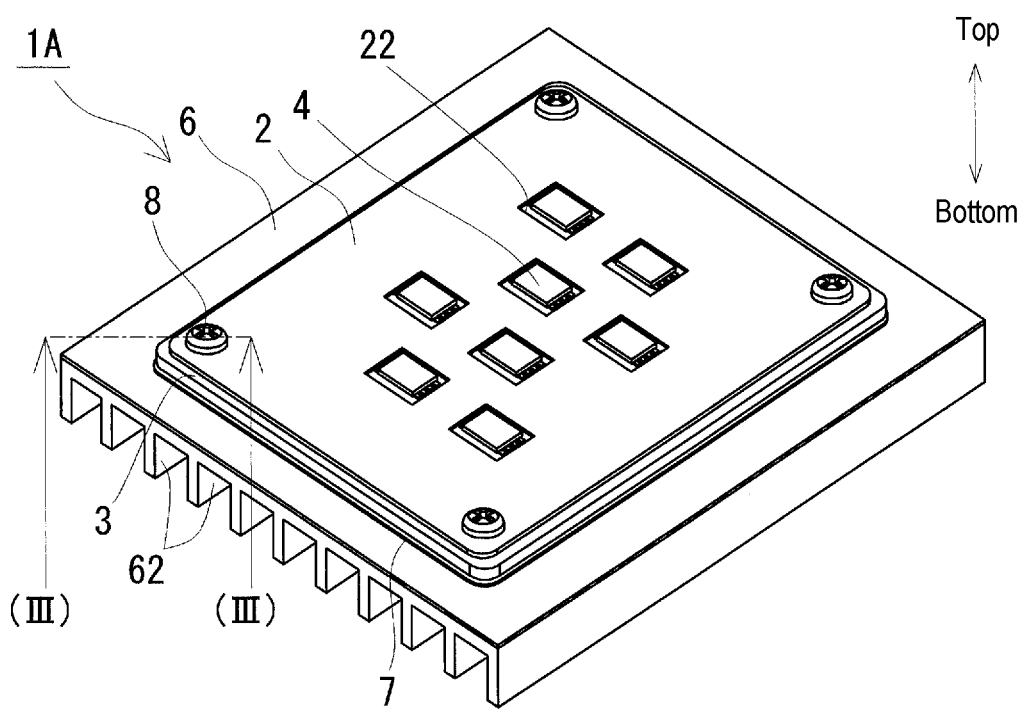
FIG. 1 is a perspective view schematically showing a circuit assembly according to Embodiment 1.

Problem that is to be Solved by the Disclosure

By fixing a circuit board and a bus bar by screwing them to a heat dissipation member with a heat transfer member interposed between the bus bar and the heat dissipation member, they can be firmly fixed with ease. However, it is desirable that the number of locations to be screwed is as low as possible. Reasons for this are that as the number of electronic components disposed on the bus bar increases, it becomes necessary to ensure more space for the electronic components, to make the circuit assembly lighter, to reduce the number of components, and to enhance the productivity.

However, if the number of screwed locations is decreased, locations of the circuit board and the bus bar that are distant from the screwed locations are pressed to the lower (heat dissipation member) side with a weaker force than at the screwed locations, and thus may be pushed up to the upper side and be flexed (curved) upward. The heat transfer member located in the vicinity of a screwed location is compressed by pressing the circuit board and the bus bar to the heat dissipation member by the axial force of the screw. When the heat transfer member has flowability, the compressing causes the heat transfer member to move from the screwed location. Due to the heat transfer member that has moved by being compressed, locations of the circuit board and the bus bar that are distant from the screwed location are pushed upward as a result of the thickness of the heat transfer member being increased and becoming more non-uniform as the distance from the screwed location increases.

When the circuit board and the bus bar are flexed upward in this manner, a load (stress) is exerted on solder that connects the bus bar and the circuit board to the electronic components, and the solder may be damaged. In addition, a gap may be formed between the flexed portion of the bus bar and the heat transfer member, thus reducing the heat dissipation.

In particular, when the circuit board and the bus bar have a small thickness, locations distant from the screwed locations tend to be flexed upward. With the above-described electronic component, in order to electrically connect each of the source terminal and the gate terminal to the bus bar and the circuit pattern of the circuit board, the source terminal and the gate terminal are displaced relative to each other in the vertical direction by an amount corresponding to the height difference as described above. Although a displacement in the vertical direction between the source terminal and the gate terminal can be formed, for example, by bending the gate terminal, the operation is complicated. When the gate terminal has a small length, the terminal can be easily bent. However, when the gate terminal has a large length, it is particularly difficult to bend the terminal. For this reason, it is conceivable to reduce the thickness of the circuit board in order to reduce a degree of bending of the terminal. However, the thinner the circuit board, the lower the rigidity thereof becomes. Consequently, locations distant from the screwed location tend to be flexed upward.

Therefore, an object is to provide a circuit assembly that has excellent heat dissipation by easily making the thickness of a heat transfer member between a bus bar and a heat dissipation member uniform, and that can maintain a state in which an electronic component is disposed on the bus bar.

Advantageous Effects of Disclosure

A circuit assembly according to an aspect of the present disclosure has excellent heat dissipation by easily making the thickness of a heat transfer member between a bus bar and a heat dissipation member uniform, and can maintain a state in which an electronic component is disposed on the bus bar.

Description of Embodiments of the Present Disclosure

First, aspects of the present disclosure will be listed and described.

A circuit assembly according to an aspect of the present disclosure includes a circuit board and a bus bar having a top face that is fixed to a bottom face of the circuit board. An electronic component is disposed on a top face of the bus bar. A heat dissipation member is disposed on a bottom face of the bus bar. A heat transfer member is interposed between the bus bar and the heat dissipation member, to transfer heat of the bus bar to the heat dissipation member. A screw extends through a stack of the circuit board and the bus bar, the screw being screwed to the heat dissipation member and fixing the stack to the heat dissipation member. A spacer is interposed between the circuit board and the heat dissipation member, the spacer surrounding at least a portion of an outer circumference of a shaft portion of the screw, and maintaining a thickness of the heat transfer member substantially uniform.

With the above-described configuration, the provision of the spacer allows the thickness of the heat transfer member between the bus bar and the heat dissipation member to be easily made uniform, and, therefore, heat can be dissipated uniformly over the entire region of the bus bar, and the circuit assembly has excellent heat dissipation.

In addition, the provision of the spacer makes it possible to maintain a state in which the electronic component is disposed on the bus bar. This is because, at the time of screwing the stack to the heat dissipation member using the screw during the production process of the circuit assembly, the provision of the spacer makes it possible to inhibit the upward flexing of the stack, thus suppressing the stress acting on solder that connects the bus bar and the electronic component.

In one embodiment of the above-described circuit assembly, the spacer may be constituted by a separate member that is independent of the heat dissipation member With the above-described configuration, the options for the constituent material of the spacer can be increased as compared with when the spacer and the heat dissipation member are molded continuously. This is because the selection of the constituent material of the spacer is not limited by the constituent material of the heat dissipation member since the spacer and the heat dissipation member are separate members.

In another embodiment of the circuit assembly in which the spacer and the heat dissipation member are separate members, the heat dissipation member may include a positioning recess that is formed on a top face thereof and is configured to position the spacer by the spacer being fitted thereto.

With the above-described configuration, it is possible to inhibit the positional displacement of the spacer between the circuit board and the heat dissipation member. When producing a circuit assembly, the spacer can be easily positioned relative to the heat dissipation member, and, therefore, the circuit assembly can be produced easily.

In another embodiment of the above-described circuit assembly, the spacer may be constituted by a protrusion that is molded in one piece with the heat dissipation member and protrudes from the top face of the heat dissipation member.

With the above-described configuration, the number of components can be reduced as compared with when the spacer and the heat dissipation member are separate members.

In another embodiment of the above-described circuit assembly, the heat transfer member may have flowability.

When the heat transfer member has flowability, the heat transfer member can move between the bus bar and the heat dissipation member at the time of screwing and fixing the stack of the circuit board and the bus bar to the heat dissipation member using the screw. Accordingly, it is possible to make the distance between the bus bar and the heat dissipation member uniform.

Details of Embodiments of the Present Disclosure

The details of embodiments of the present disclosure will be described below with reference to the drawings. In the drawings, the same reference numerals denote the same components.

Embodiment 1

Circuit Assembly

A circuit assembly 1A according to Embodiment 1 will be described with reference to FIGS. 1 to 3. The circuit assembly 1A includes a circuit board 2, bus bars 3 that are fixed to the bottom face of the circuit board 2, electronic components 4 that are disposed on the bus bar 3, and a heat dissipation member 6 that is disposed on the bottom face of the bus bars 3. A stack of the circuit board 2 and the bus bars 3 is screwed and fixed to the heat dissipation member 6 using screws 8, with a heat transfer member 7 interposed therebetween. A feature of the circuit assembly 1A lies in that it includes a spacer 9 that is interposed between the circuit board 2 and the heat dissipation member 6, surrounding at least a portion of the outer circumference of a shaft portion 84 of the screws 8, thus making the thickness of the heat transfer member 7 substantially uniform. In the following, this will be described in detail. For the sake of convenience of the following description, the bus bar 3 side of the circuit board 2 of the circuit assembly 1A is assumed to be the "bottom", and the side opposite thereto is assumed to be the "top". FIG. 2 shows, in an exploded view, a location where the circuit board 2 and a bus bar 3 are fixed to the heat dissipation member 6 using a screw 8. FIG. 3 is a partial cross-sectional view taken along the cutting line passing through the center of the screw 8, in which, for the sake of convenience of description, the screw 8 is shown in a side view, instead of a cross-sectional view, and the parts other than the screw 8 are shown in a cross-sectional view.

Circuit Board

The circuit board 2 is a plate-shaped member on which the electronic components 4 are mounted, and includes arrangement through holes 22 (FIG. 1) for allowing the electronic components 4 to be disposed on the bus bars 3, and screw insertion holes 24 through which a screw 8 (described later) can be passed to screw the circuit board 2 to the heat dissipation member 6 (FIGS. 2, 3). The arrangement through holes 22 and the screw insertion holes 24 extend through the top and bottom faces of the circuit board 2. The arrangement through holes 22 have a rectangular contour conforming to the outer shape of the electronic component 4, and the arrangement through holes 22 are larger than the electronic components 4 as viewed in plan view. The screw insertion hole 24 has a circular contour, and the screw insertion hole 24 is larger than the shaft portion 84 of the screw 8, but smaller than the head portion 82 of the screw 8. A circuit pattern (not shown) made of a copper foil is formed on one side (top face) of the circuit board 2. A circuit pattern may also be further formed on the other side (bottom face) of the circuit board 2 as needed. A printed circuit board may be used as the circuit board 2. The top face of the circuit board 2 is pressed by the head portion 82 of the screw 8. Through this pressing, the circuit board 2 is fixed to the heat dissipation member 6. The bus bar 3 is fixed to the bottom face of the circuit board 2, and the bottom face is stopped in abutment by the top face of a spacer 9, which will be described later.

Bus Bars

Figure 2:
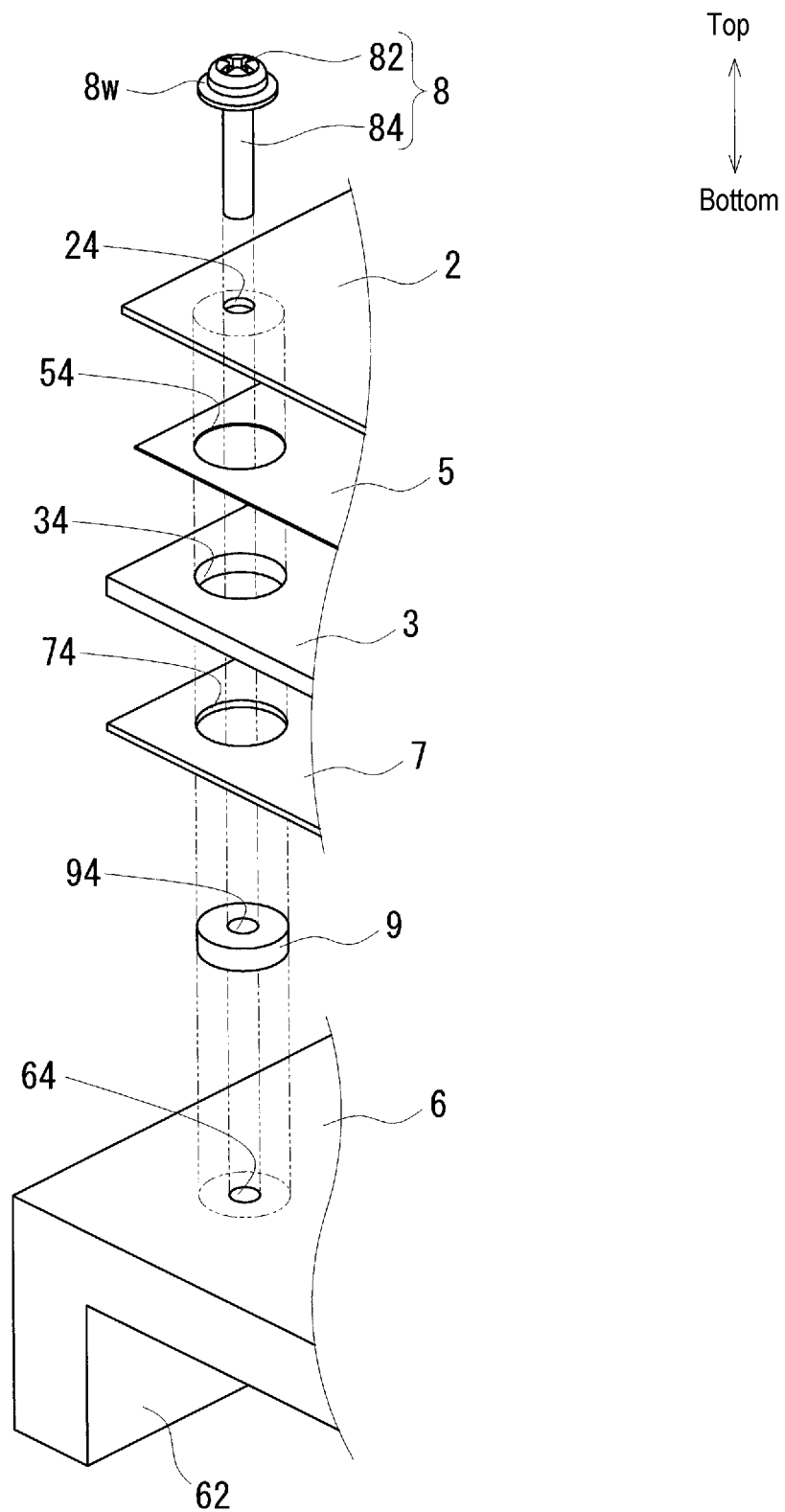
FIG. 2 is an exploded perspective view schematically showing the circuit assembly according to Embodiment 1.
Figure 3:
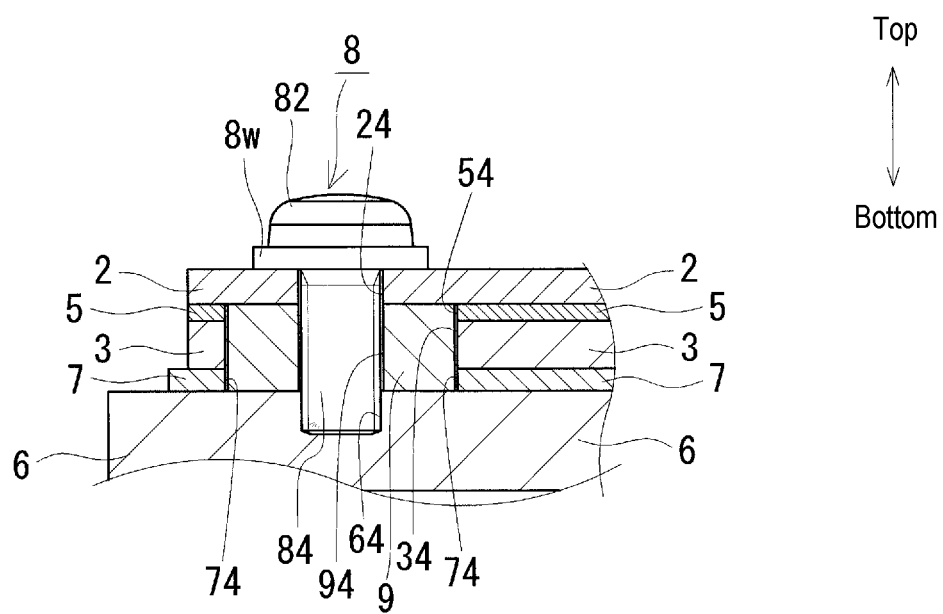
FIG. 3 is a cross-sectional view showing the circuit assembly, taken along the cutting line (III)-(III) shown in FIG. 1.

The bus bars 3 are part of a power circuit (FIGS. 1 to 3). The bus bar 3 is connected to a power supply and an electrical load. Examples of the material of the bus bar 3 include conductive metals, and specific examples include copper and a copper alloy. A plurality of bus bars 3 are provided, and the plurality of bus bars 3 are fixed to the other side (bottom face) of the circuit board 2 and are spaced apart from each other. To fix the plurality of bus bars 3 to the circuit board 2, a pressure-sensitive adhesive sheet 5 (described later) interposed therebetween can be used. Bus bar insertion hole 34 are formed in the bus bars 3.

Bus Bar Insertion Holes

The bus bar insertion holes 34 are holes for allowing passage of the shaft portion 84 of the screws 8 for screwing the bus bars 3 to the heat dissipation member 6. Each bus bar insertion hole 34 extends through the top and bottom faces of the bus bar 3. The position in which the bus bar insertion hole 34 is formed is set to be a position coaxial with the screw insertion hole 24 of the circuit board 2. The bus bar insertion hole 34 also allows passage of a spacer 9, which will be described later, in addition to the shaft portion 84 of the screw 8. That is, the contour and the size of the bus bar insertion hole 34 can be appropriately selected depending on whether only the shaft portion 84 of the screw 8 is passed through the bus bar insertion hole 34, or the spacer 9 is also passed through the bus bar insertion hole 34, in addition to the shaft portion 84 of the screw 8.

If the bus bar insertion hole 34 only allows passage of the shaft portion 84 of the screw 8, the bus bar insertion hole 34 may have a circular contour, and the size thereof may be a size that is large enough to prevent the bus bar insertion hole 34 from coming into contact with the shaft portion 84 of the screw 8 but smaller than the size of the head portion 82 of the screw 8. On the other hand, when the bus bar insertion hole 34 allows passage of the shaft portion 84 of the screw 8 as well as the spacer 9, the bus bar insertion hole 34 may have a contour conforming to the outer shape of the spacer 9, and the size thereof may be appropriately selected according to the material of the constituent material of the spacer 9. For example, when the spacer 9 is made of a conductive material, the bus bar insertion hole 34 may have a size that is sufficient to prevent the bus bar insertion hole 34 from coming into contact with the spacer 9. When at least the outer side of the spacer 9 is made of an insulating material, the bus bar insertion hole 34 may have a size that allows the bus bar insertion hole 34 to come into contact with the spacer 9, or a size sufficient to prevent the bus bar insertion hole 34 from coming into contact with the spacer 9.

Here, the bus bar insertion hole 34 allows passage of the shaft portion 84 of the screw 8 and the spacer 9. The bus bar insertion hole 34 has a circular contour, and has a size that is sufficient to prevent the bus bar insertion hole 34 from coming into contact with the spacer 9.

Electronic Components

The electronic components 4 are mounted to both the circuit pattern of the circuit board 2 and the bus bar 3 (FIG. 1). Examples of the electronic components include switching elements such as a relay and a FET (field effect transistor). The electronic components 4 are disposed on the bus bars 3, and include a terminal that is connected to the circuit pattern of the circuit board 2 or the bus bars 3. A plurality of terminals can be provided. A plurality of a single type of terminals may be provided, or a plurality of different types of terminals may be provided. Here, a FET is used as the electronic component 4, and includes a gate terminal, a source terminal, and a drain terminal. The gate terminal is electrically connected to the circuit pattern of the circuit board 2. The source terminal and the drain terminal are electrically connected to different bus bars. For the mechanical and the electrical connection between these components, a connection metal material, typically, solder (not shown) can be used.

Pressure-sensitive Adhesive Sheet

The pressure-sensitive adhesive sheet 5 bonds the circuit board 2 and the plurality of bus bars 3 (FIGS. 1 to 3) together. The pressure-sensitive adhesive sheet 5 is disposed in a continuous manner on the top faces of the plurality of bus bars 3, straddling the plurality of bus bars 3. Examples of the material of which the pressure-sensitive adhesive sheet 5 can be made include highly heat-resistant pressure-sensitive adhesives, and insulating adhesives such as an epoxy resin. Sheet insertion holes 54 (FIG. 2) similar to the bus bar insertion holes 34, and component openings (not shown) similar to the arrangement through hole 22 of the circuit board 2 are formed in the pressure-sensitive adhesive sheet 5. The sheet insertion holes 54 extend through the top and bottom faces of the pressure-sensitive adhesive sheet 5, and serve to allow passage of the shaft portion 84 of the screw 8 and the spacer 9. The formation positions, the contour and the size of the sheet insertion holes 54 are the same as those of the bus bar insertion holes 34 of the bus bar 3. The component openings extend through the top and bottom faces of the pressure-sensitive adhesive sheet 5, and serve to allow the electronic components 4 to be disposed on the bus bars 3. The formation positions, the contour and the size of the component opening are the same as those of the arrangement through holes 22.

Heat Dissipation Member

The heat dissipation member 6 dissipates the heat of the bus bar 3 during use. The heat dissipation member 6 is disposed on the bottom face of the bus bars 3. The size of the heat dissipation member 6 may be a size that enables the heat dissipation member 6 to be in contact with the bottom face of all the bus bars 3. The heat dissipation member 6 may be constituted by a flat plate-shaped member. However, here, a flat plate-shaped member and fins 62 composed of a plurality of projections protruding from the bottom face of the flat plate-shaped member are formed in one piece. Consequently, the surface area of the heat dissipation member 6 can be easily increased, thus enhancing the heat dissipation. Here, the top face of the heat dissipation member 6 is flat. Screw holes 64 with which the screws 8 are threadably engaged are formed in the top face of the heat dissipation member 6. The spacers 9 are disposed around the screw holes 64 in the top face of the heat dissipation member 6. Examples of the constituent material of the heat dissipation member 6 include metal materials having excellent thermal conductivity. Examples of such metal materials include aluminum and aluminum alloys.

Heat Transfer Member

The heat transfer member 7 transfers the heat of the bus bars 3 to the heat dissipation member 6. The heat transfer member 7 is interposed between the bus bars 3 and the heat dissipation member 6. The area in which the heat transfer member 7 is formed may be an entire area between the bus bar 3 and the heat dissipation member 6, excluding locations where the spacers 9 are provided. Preferably, the heat transfer member 7 fills the space between the bus bars 3 and the heat dissipation member 6 without any gap. This facilitates the transfer of the heat of the bus bars 3 to the heat dissipation member 6. The heat transfer member 7 may be formed by coating its constituent material, or may be formed by a heat transfer (heat dissipation) sheet. A spacer insertion hole 74 through which the spacer 9 is passed is formed in the heat transfer member 7 (FIGS. 2, 3). The spacer insertion hole 74 may have a contour conforming to the outer shape of the spacer 9, and it is a circular shape here.

The thickness of the heat transfer member 7 is substantially uniform. Although the details will be described later, the thickness of the heat transfer member 7 can be adjusted with the spacers 9. The smaller the thickness of the heat transfer member 7, the higher the heat dissipation can be.

The heat transfer member 7 may be provided in a form in which it has flowability without being cured, or in a form in which the heat transfer member 7 has little flowability as a result of being cured after the screws 8 have been fastened. Having flowability as used here may mean having a viscosity of 500 Pa·s or less, for example. The viscosity of the heat transfer member 7 is preferably 400 Pa·s or less, particularly preferably 300 Pa·s or less. When the heat transfer member 7 has flowability, the heat transfer member 7 can move between the bus bars 3 and the heat dissipation member 6 at the time of screwing and fixing a stack of the circuit board 2 and the bus bars 3 to the heat dissipation member 6 using the screw 8. Accordingly, the distance between the bus bars 3 and the heat dissipation member 6 can be made uniform.

Examples of the constituent material of the heat transfer member 7 include insulating resins having excellent thermal conductivity. Specific examples of the resin include an epoxy resin and a silicone resin. Preferably, the resin contains an inorganic filler. Specific examples of the filler include an alumina filler. The heat transfer member 7 may be made of an adhesive made of any of the above-described insulating resins.

Screws

The screws 8 extend through the stack of the circuit board 2 and the bus bars 3, and screw and fix the stack to the heat dissipation member 6. The screws 8 include a head portion 82 that presses the top face of the circuit board 2 to the bottom face side, and a shaft portion 84 that is passed through the screw insertion hole 24 of the circuit board 2 and a screw insertion hole 94 (described later) of the spacer 9, and fixed to the screw hole 64 of the heat dissipation member 6. Examples of the constituent material of the screw 8 include metal materials. By making the screws 8 of a metal material, the above-described stack can be firmly fixed to the heat dissipation member 6 with ease.

A washer 8*w* is interposed between the head portion 82 of the screw 8 and the top face of the circuit board 2. This suppresses the depression of the top face of the circuit board 2. The type of the washer 8*w* is a flat washer, which is flat and disk-shaped. The size of the washer 8*w* is larger than that of the head portion 82. This provides a larger bearing surface area, allowing the above-described stack to be firmly fixed by screwing to the heat dissipation member 6 with ease.

Spacers

The spacers 9 maintain the thickness of the heat transfer member 7 substantially uniform. This is because the spacers 9 can inhibit a location of the stack that is distant from the screwed location from being flexed upward at the time of fixing the stack of the circuit board 2 and the bus bars 3 to the heat dissipation member 6 using the screws 8. The inhibition of the flexing can suppress the load on the solder connecting the circuit board 2 and the bus bars 3 to the electronic components 4. Accordingly, it is possible to suppress the damage to the solder, and to maintain a favorable connection state of the circuit board 2 and the bus bars 3 to the electronic components 4.

The spacers 9 are interposed between the circuit board 2 and the heat dissipation member 6, and surround at least a portion of the outer circumference of the shaft portion 84 of the screws 8. Being interposed between the circuit board 2 and the heat dissipation member 6 includes a case where the top face of the spacer 9 is in abutment against the bottom face of the circuit board 2 as in the present embodiment, and a case where the top face of the spacer 9 is in abutment against the bottom face of the bus bar 3 as in Embodiment 2, which will be described later. By bringing the top face of the spacer 9 into abutment against the bottom face of the circuit board 2, electrical insulation can be provided between the spacer 9 and the bus bar 3 by increasing the size of the bus bar insertion hole 34 to a size larger than that of the spacer 9 without forming an insulating layer on the surface of the spacer 9 even when the spacer 9 is made of a metal material. Depending on the form of presence of the spacer 9, the bottom face of the spacer 9 may be in abutment against the top face of the heat dissipation member 6 as in the present embodiment, or may be integrated with the top face of the heat dissipation member 6.

The spacers 9 may be provided in a form in which the spacers 9 are constituted by separate members that are independent of the heat dissipation member 6 as in the present embodiment, or they may be formed continually (in one piece) with the heat dissipation member 6, as will be described in detail in Embodiment 4. By forming the spacers 9 and the heat dissipation member 6 as separate members, the options for the constituent material of the spacers 9 can be increased as compared with when the spacers 9 and the heat dissipation member 6 are molded continuously (in one piece). This is because the selection of the constituent material of the spacers 9 is not limited by the constituent material of the dissipation member 6.

Each spacer 9 surrounds at least a portion of the outer circumference of the shaft portion 84 of a screw 8. The perimeter of the spacer 9 along the circumferential direction of the outer circumference of the shaft portion 84 does not need to extend over the entire outer circumference of the shaft portion 84, so long as the spacer 9 can receive the axial force of the screw 8, and can maintain the thickness of the heat transfer member 7 substantially uniform. That is, a region in which a portion of the outer circumference of the shaft portion 84 is not surrounded by the spacer 9 may be provided. The above-described perimeter of the spacer 9 is preferably as long as possible, and is, for example, preferably ⅓ or more of the outer circumference of the shaft portion 84, more preferably ½ or more of the outer circumference of the shaft portion 84, further preferably ⅔ or more, particularly preferably a length extending over the entire outer circumference of the shaft portion 84. When the spacer 9 is provided at a portion of the outer circumference of the shaft portion 84, the spacer 9 may be formed by a plurality of divided pieces. In that case, the plurality of divided pieces may be provided and equally spaced along the direction of the outer circumference of the shaft portion 84.

Here, the spacer 9 is formed in a ring shape that surrounds the entire outer circumference of the shaft portion 84. The hole at the center of the spacer 9 is a screw insertion hole 94 that allows passage of the shaft portion 84 of the screw 8. The inner diameter of the spacer 9 (the size of the screw insertion hole 94) is smaller than the size of the head portion 82 of the screw 8, and sufficient to allow passage of the shaft portion 84, and the outer diameter of the spacer 9 is larger than the sizes of the head portion 82 and the washer 8w of the screw 8.

The thickness of the spacer 9 can be appropriately selected according to the desired thickness of the heat transfer member 7. This is because adjusting the thickness of the spacer 9 makes it possible to adjust the interval between the bottom face of the bus bar 3 and the top face of the heat dissipation member 6, thus adjusting the thickness of the heat transfer member 7. The thickness of the spacer 9 may be "(Total thickness of Pressure-sensitive adhesive sheet 5 and Bus bar 3)+(Desired thickness of Heat transfer member 7)". This is because, here, the spacer 9 is interposed between the bottom face of the circuit board 2 and the top face of the heat dissipation member 6, and, therefore, the thickness of the heat transfer member 7 is "Thickness of Spacer 9−(Total thickness of Pressure-sensitive adhesive sheet 5 and Bus bar 3)".

The constituent material of the spacer 9 is not particularly limited, so long as it is a material having a hardness sufficient to withstand the axial force of the screw 8 with substantially no deformation. Examples of the constituent material of the spacer 9 include hard materials such as ceramics, and metal materials. When the spacer 9 is formed using a metal material, an insulating layer made of an insulating material may be preferably formed on the surface thereof. By doing so, it is possible to prevent electrical conduction between the spacer 9 and the bus bar 3.

Usage

The circuit assembly 1A can be suitably applied to automobile electrical junction boxes. The circuit assembly 1A can be suitably applied to substrates for a large-current power circuit, such as a DC voltage converter, an AC/DC converter, and a DC/AC inverter.

Operation and Effects

With the circuit assembly 1A according to Embodiment 1, the following effects can be achieved.

The circuit assembly 1A has excellent heat dissipation. This is because the provision of the spacers 9 allows the thickness of the heat transfer member 7 to be easily made uniform, and, therefore, heat can be dissipated uniformly over the entire region of the bus bars 3 with ease.

A state in which the electronic components 4 are disposed on the bus bars 3 can be maintained. This is because, at the time of screwing the above-described stack to the heat dissipation member 6 using the screws 8 during the production process of the circuit assembly 1A, the provision of the spacers 9 makes it possible to inhibit the upward flexing of the stack, thus suppressing the stress acting on solder that connects the bus bars 3 and the electronic components 4.

The number of screws 8 can be decreased. This is because the provision of the spacers 9 makes it possible to inhibit the upward flexing of the stack.

Production Method of Circuit Assembly

The circuit assembly 1A can be produced by a production method of a circuit board, including a preparation step, a heat transfer member formation step, and a screwing step. In the following, the steps will be described in sequence.

Preparation Step

In the preparation step, a stack in which a circuit board 2 and bus bars 3 are stacked using a pressure-sensitive adhesive sheet 5, and electronic components 4 are mounted to the circuit board 2 and the bus bars 3; a heat dissipation member 6; screws 8; and spacers 9 are prepared.

Heat Transfer Member Formation Step

In the heat transfer member formation step, a constituent material of a heat transfer member 7 having flowability is formed on a top face of the heat dissipation member 6. Having flowability may mean having a viscosity of not more than 500 Pa·s, for example. By doing so, as compared with when a solid heat transfer member 7 is formed, the thickness of the heat transfer member 7 can be easily made uniform in the screwing step described later, and voids are less likely formed between the heat transfer member 7 and the bus bars 3 or the heat dissipation member 6. Moreover, the upward flexing of the circuit board 2 and the bus bars 3 can be easily inhibited. The viscosity of the heat transfer member 7 is preferably 400 Pa·s or less, particularly preferably 300 Pa·s or less. The lower limit of the viscosity of the heat transfer member 7 may be a viscosity sufficient to prevent the heat transfer member 7 from flowing out from the surface of the heat dissipation member 6 during the production operation, and is preferably a viscosity sufficient to impart a considerable degree of shape retention to the heat transfer member 7 itself. Examples of the lower limit of the viscosity of the heat transfer member 7 include a viscosity of about 15 Pa·s. The heat transfer member 7 may be a heat transfer member 7 that has flowability without being cured after the screwing step described later, or a heat transfer member 7 that has little flowability by being cured after the screwing step. When the heat transfer member 7 is not cured, the viscosity of the heat transfer member 7 is substantially equal to the viscosity of its constituent material. The heat transfer member 7 may be formed by screen printing, or may be performed by placing a sheet-like heat transfer (heat dissipation) material.

Screwing Step

In the screwing step, the above-described stack is fixed to the heat dissipation member 6 by being screwed using the screws 8. The spacers 9 are disposed at a predetermined position on the top face of the heat dissipation member 6. The insertion holes of the stack are fitted to the spacers 9, and the top face of the spacer 9 and the bottom face of the circuit board 2 are brought into abutment against each other. The shaft portion 84 of the screws 8 is passed through the insertion holes of the stack, and is screwed to the screw hole 64 of the heat dissipation member 6.

Operation and Effects

With the production method of a circuit assembly according to Embodiment 1, the following effects can be achieved.

A circuit assembly 1A including a heat transfer member 7 having a substantially uniform thickness between the bus bars 3 and the heat dissipation member can be produced. This is because, at the time of screwing with the screws 8, interposing the spacers 9 between the circuit board 2 and the heat dissipation member 6 makes it possible to inhibit the axial force of the screws 8 from excessively acting on the heat transfer member 7.

A circuit assembly 1A with a favorable connection state of the circuit board 2 and the bus bars 3 to the electronic component 4 can be produced. This is because the provision of the spacers 9 makes it possible to inhibit the upward flexing of the above-described stack at the time of screwing the screws 8. By inhibiting the flexing, it is possible to suppress the load on the solder connecting the circuit board 2 and the bus bars 3 to the electronic component 4, thus suppressing damage to the solder.

Embodiment 2

Circuit Assembly

Figure 4:
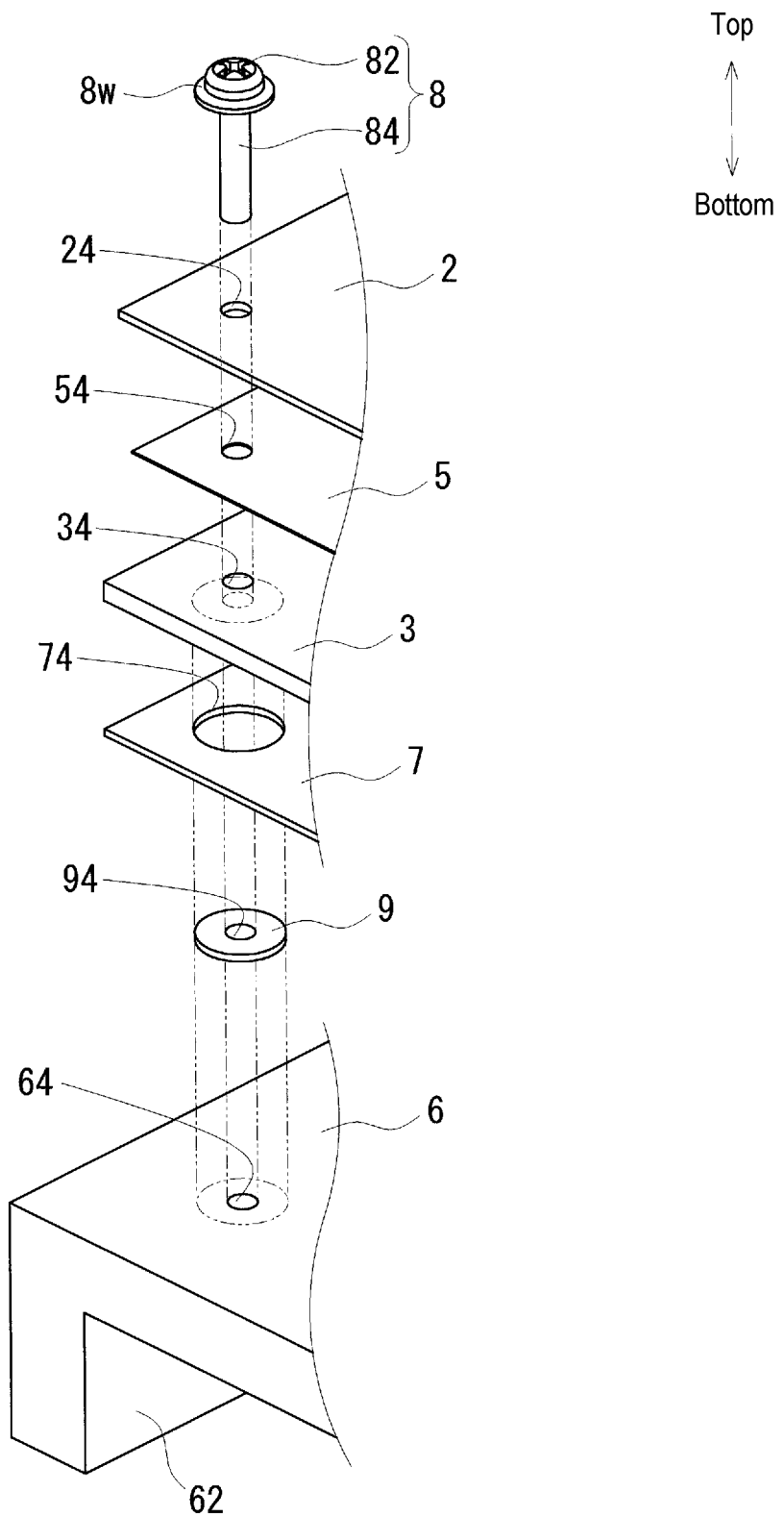
FIG. 4 is a partially exploded perspective view schematically showing a circuit assembly according to Embodiment 2.
Figure 5:
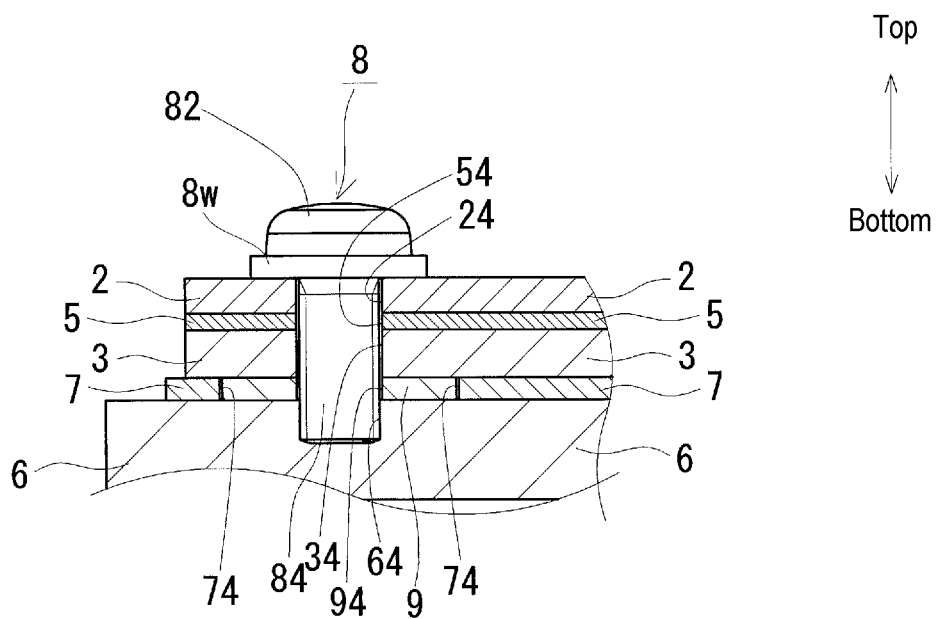
FIG. 5 is a partial cross-sectional view showing the circuit assembly according to Embodiment 2, taken along the cutting line passing through the center of a screw with which a circuit board and a bus bar are fixed to a heat dissipation member.

A circuit assembly according to Embodiment 2 will be described with reference to FIGS. 4 and 5. The main difference between the circuit assembly according to Embodiment 2 and Embodiment 1 is that the thickness of the spacer 9 is substantially the same as the thickness of the heat transfer member 7 (FIG. 5). In this case, each of the size of the bus bar insertion hole 34 of the bus bar 3 and the size of the sheet insertion hole 54 of the pressure-sensitive adhesive sheet 5 is larger than the size of the shaft portion 84 of the screw 8 and is smaller than the size of the spacer 9 (FIGS. 4, 5). Accordingly, the top face of the spacer 9 comes into abutment against the bottom face of the bus bar 3. If the spacer 9 is formed using a metal material, an insulating layer is formed on a surface of the spacer 9 that comes into contact with the bus bar 3. By doing so, it is possible to provide electrical insulation between the spacer 9 and the bus bar 3.

Operation and Effects

With the circuit assembly according to Embodiment 2, as with the circuit assembly 1A of Embodiment 1, the axial force of screws 8 does not excessively act on the heat transfer member 7, so that a substantially uniform thickness can be ensured for the heat transfer member 7, preventing the bus bars 3 and the circuit board 2 from being flexed. Consequently, the circuit assembly has excellent heat dissipation, and can maintain a state in which the electronic component 4 are disposed on the bus bars 3.

Embodiment 3

Circuit Assembly

Figure 6:
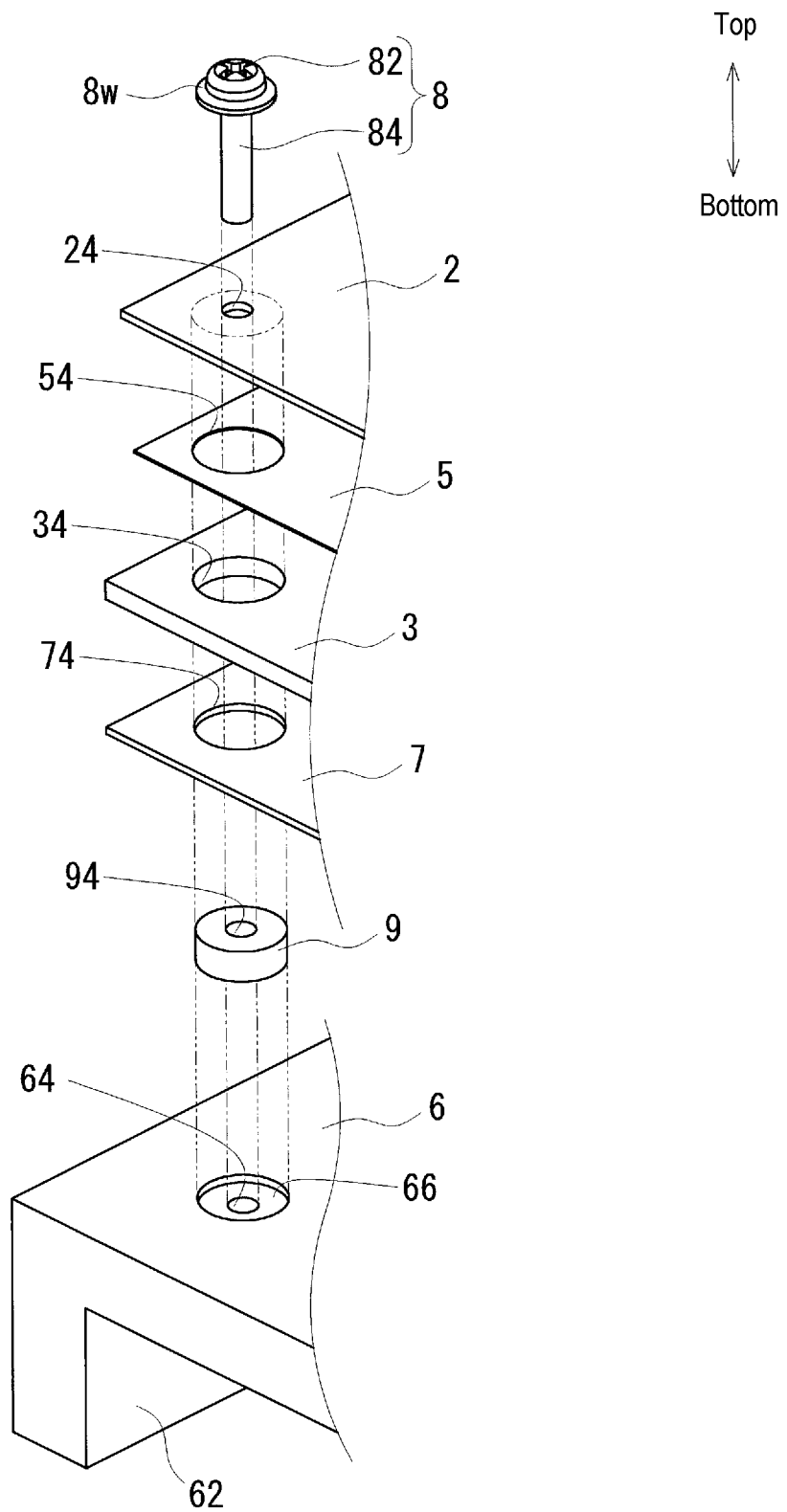
FIG. 6 is a partially exploded perspective view schematically showing a circuit assembly according to Embodiment 3.
Figure 7:
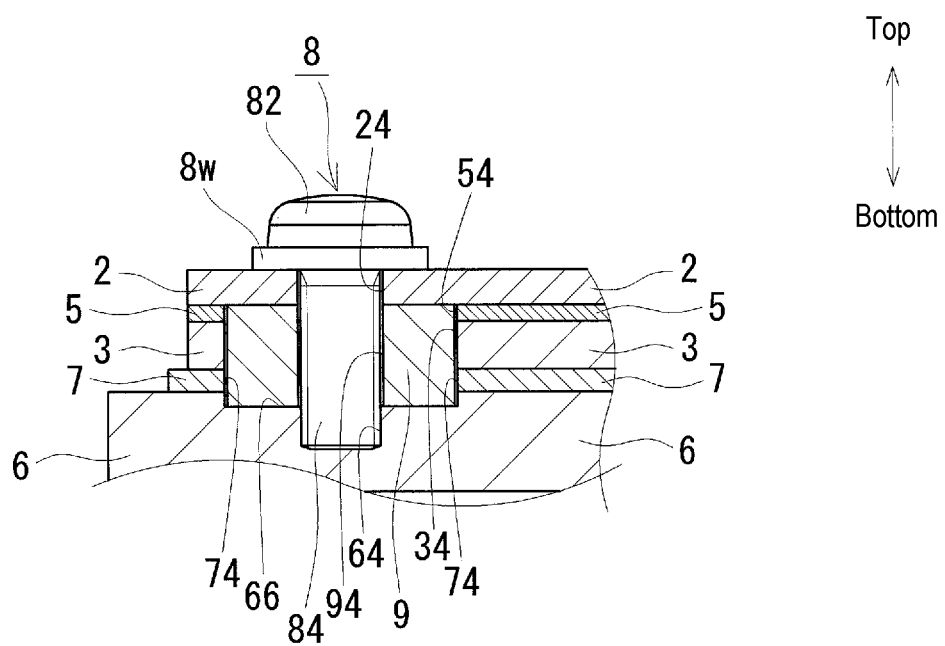
FIG. 7 is a partial cross-sectional view showing a circuit assembly according to Embodiment 3, taken along the cutting line passing through the center of a screw with which a circuit board and a bus bar are fixed to a heat dissipation member.

A circuit assembly according to Embodiment 3 will be described with reference to FIGS. 6 and 7. The main difference between the circuit assembly according to Embodiment 3 and Embodiment 1 is that the heat dissipation member 6 includes a positioning recess 66. The positioning recess 66 positions the spacer 9 by the spacer 9 being fitted thereto (FIG. 7). The shape of the positioning recess 66 may be a circular shape conforming to the outer shape of the spacer 9, and the size of the positioning recess 66 may be sufficient to enable smooth fitting of the spacer 9, but small enough to minimize play after fitting. The depth of the positioning recess 66 can be selected as appropriate within an extent that the positional displacement of the spacer 9 does not occur. The thickness of the spacer 9 may be preferably larger than that of the spacer 9 of Embodiment 1 by the depth of the positioning recess 66.

Operation and Effects

With the circuit assembly according to Embodiment 3, the provision of the positioning recess 66 makes it possible to inhibit the positional displacement of the spacers 9, in addition to achieving the same effects as those of Embodiment 1. Accordingly, the spacers 9 can be easily positioned relative to the top face of the heat dissipation member 6 during the production process of the circuit assembly, and, therefore, the circuit assembly can be produced easily.

Embodiment 4

Circuit Assembly

A circuit assembly according to Embodiment 4 will be described with reference to FIGS. 8 and 9. The main difference between the circuit assembly according to Embodiment 4 and the Embodiment 1 is that the spacer 9 is formed continuously with the heat dissipation member 6 (formed in one piece) (FIG. 9), rather than being formed by a separate member that is independent of the heat dissipation member 6 as in Embodiment 1. That is, the constituent material of the spacer 9 is the same as the material of the heat dissipation member 6. The spacer 9 is constituted by a protrusion 69 that is molded in one piece with the heat dissipation member 6, protruding upward from the top face of the heat dissipation member 6.

Figure 8:
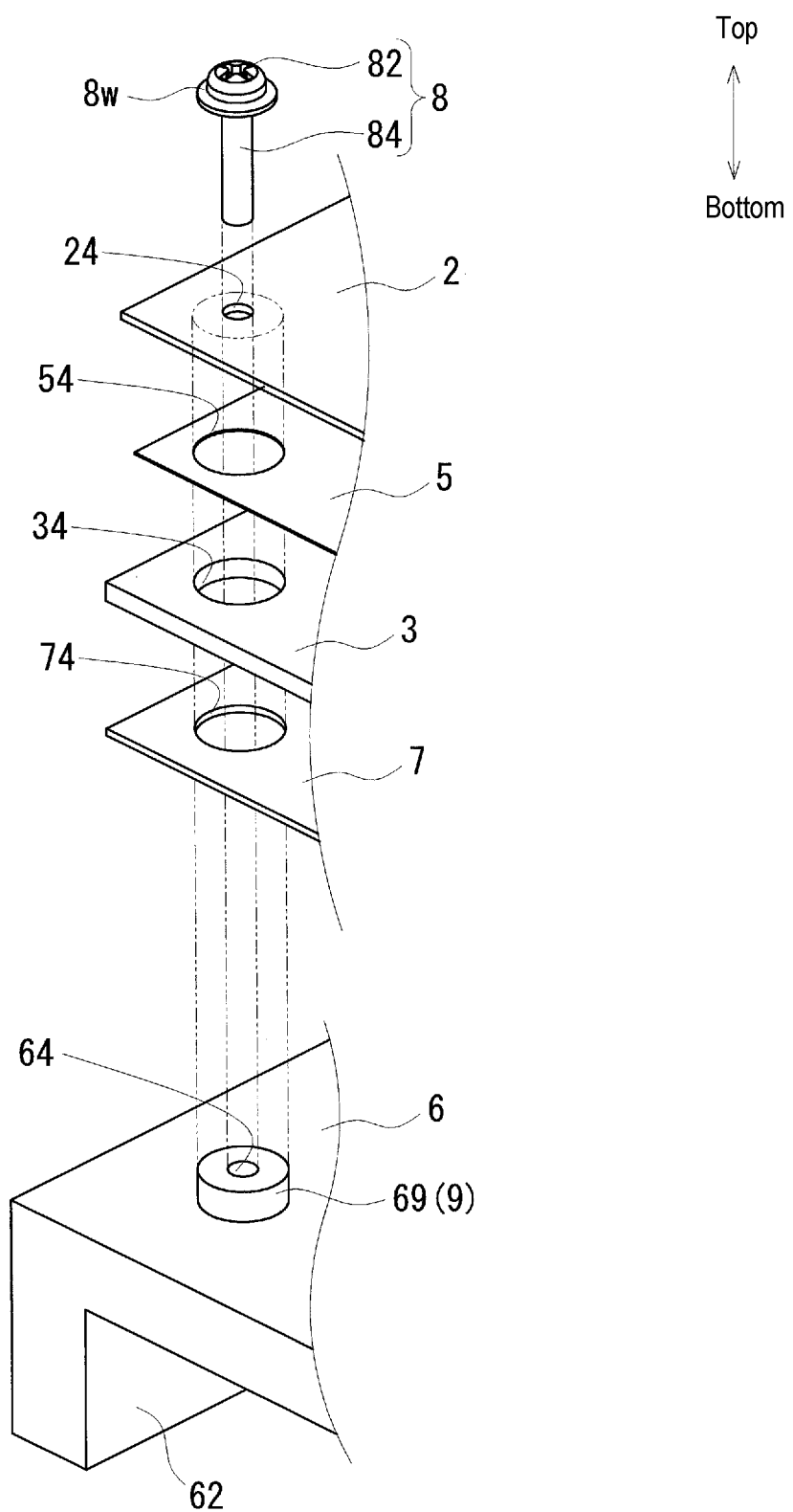
FIG. 8 is a partially exploded perspective view schematically showing a circuit assembly according to Embodiment 4.
Figure 9:
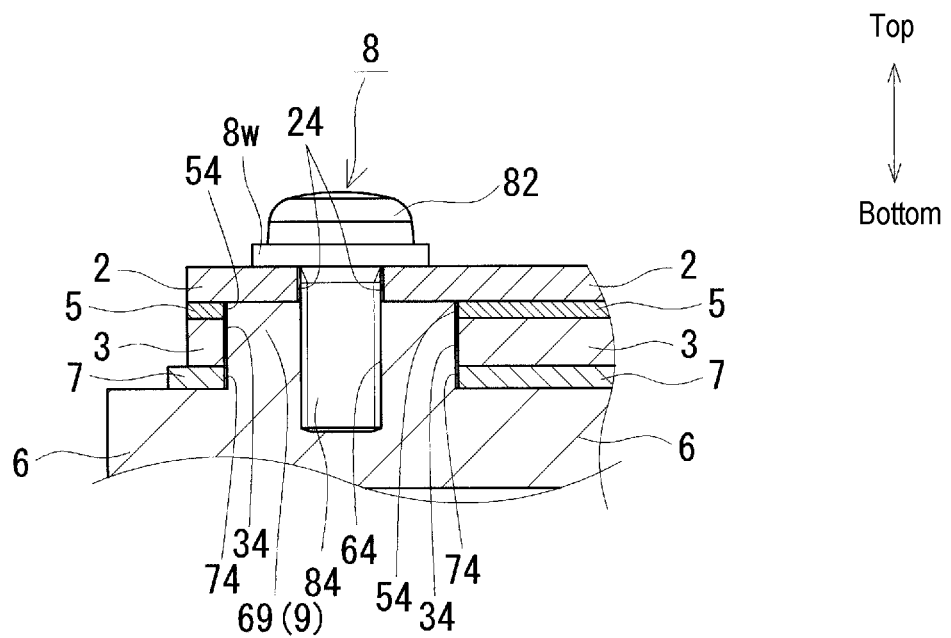
FIG. 9 is a partial cross-sectional view showing the circuit assembly according to Embodiment 4, taken along the cutting line passing through a screw with which a fix circuit board and a bus bar are fixed to a heat dissipation member.

As shown in FIG. 8, the protrusion 69 may have a ring shape just like the spacer 9 (FIGS. 1 to 3) of Embodiment 1, and the inner diameter and the outer diameter of the protrusion 69 may be the same as those of the spacer 9 (FIGS. 1 to 3) of Embodiment 1. As shown in FIG. 9, the protrusion 69 may have a thickness (height) that allows the top face of the protrusion 69 and the bottom face of the circuit board 2 to be in abutment against each other as with the spacer 9 (FIGS. 1 to 3) of Embodiment 1, or may be, although not shown, a thickness (height) sufficient to allow the top face of the protrusion 69 and the bottom face of the bus bar 3 to be in abutment against each other as with the spacer 9 of Embodiment 2 (FIGS. 4, 5). When the thickness of the protrusion 69 is a thickness sufficient to allow the top face of the protrusion 69 and the bottom face of the bus bar 3 to be in abutment against each other, an insulating layer is formed on a surface of the protrusion 69 that comes into contact with the bus bar 3. By doing so, it is possible to provide electrical insulation between the bus bar 3 and the protrusion 69 (heat dissipation member 6).

Operation and Effects

With the circuit assembly according to Embodiment 4, the spacers 9 are formed continuously with the heat dissipation member 6, and it is therefore possible to reduce the number of components as compared with the circuit assemblies of Embodiments 1 to 3, in addition to achieving the same effects as those of the circuit assemblies of Embodiments 1 to 3.

The present disclosure is defined by the claims, rather than being limited to the above-described examples, and intended to include all modifications which fall within the scope of the claims and the meaning and scope of equivalents thereof.

The invention claimed is:

1. A circuit assembly comprising:
  a circuit board;
  a bus bar having a top face that is fixed to a bottom face of the circuit board;
  an electronic component that is disposed on a top face of the bus bar;
  a heat dissipation member that is disposed on a bottom face of the bus bar;
  a heat transfer member that is interposed between the bus bar and the heat dissipation member, to transfer heat of the bus bar to the heat dissipation member; and
  a screw that extends through a stack of the circuit board and the bus bar, the screw being screwed to the heat dissipation member, fixing the stack to the heat dissipation member; and
  a spacer that is interposed between the circuit board and the heat dissipation member, the spacer surrounding at least a portion of an outer circumference of a shaft portion of the screw, the spacer having a top surface engaged with a bottom surface of the circuit board and a bottom surface engaged with a top surface of the heat dissipation member so as to maintain a thickness of the heat transfer member substantially uniform.

2. The circuit assembly according to claim 1, wherein the spacer is constituted by a separate member that is independent of the heat dissipation member.

3. The circuit assembly according to claim 2, wherein the heat dissipation member includes a positioning recess that is formed on a top face thereof and is configured to position the spacer by the spacer being fitted thereto.

4. The circuit assembly according to claim 3, wherein the heat transfer member has flowability.

5. The circuit assembly according to claim 2, wherein the heat transfer member has flowability.

6. The circuit assembly according to claim 1, wherein the heat transfer member has flowability.

* * * * *